United States Patent [19]

Yano et al.

[11] Patent Number: 4,498,153
[45] Date of Patent: Feb. 5, 1985

[54] OUTPUT SIGNAL DETECTORS OF MAGNETIC BUBBLE MEMORY DEVICES

[75] Inventors: Ryuji Yano; Shinsaku Chiba; Kazutoshi Yoshida; Kazuhiro Ishida; Shoji Yoshimoto, all of Mobara, Japan

[73] Assignee: Hitachi, Ltd., Tokyo, Japan

[21] Appl. No.: 356,641

[22] Filed: Mar. 10, 1982

[30] Foreign Application Priority Data

Mar. 13, 1981 [JP] Japan ................................. 56-35330

[51] Int. Cl.³ .............................................. G11C 19/08
[52] U.S. Cl. ..................................................... 365/10
[58] Field of Search ............................................ 365/8

[56] References Cited

U.S. PATENT DOCUMENTS

| 4,318,186 | 3/1982 | Wynn ........................................ 365/8 |
| 4,369,501 | 1/1983 | Brown et al. ............................. 365/8 |

OTHER PUBLICATIONS

The Bell System Technical Journal—vol. 60, No. 4, Apr. 1981, pp. 485-500.

*Primary Examiner*—James W. Moffitt
*Attorney, Agent, or Firm*—Charles E. Pfund

[57] ABSTRACT

In a detector of an magnetic bubble memory device of the type comprising a magnetic bubble memory element having a detector, a source of constant current for passing constant current through the detector for producing a bubble output signal according to the magnetoresistive effect of a detector, a preamplifier for amplifying the output signal, a DC regenerator for regenerating an output signal of the preamplifier and a discriminator for converting the DC regenerated signal into a binary code, there is provided a holding circuit connected between the DC regenerator and the discriminator for holding a peak value of the DC regenerated signal for a predetermined time.

2 Claims, 4 Drawing Figures

OUTPUT SIGNAL DETECTORS OF MAGNETIC BUBBLE MEMORY DEVICES

BACKGROUND OF THE INVENTION

This invention relates to an output signal detector of a magnetic memory device capable of gaining a sufficient margin of the logical conversion for one bubble output signal.

In a magnetic bubble memory device, magnetic bubbles are generated in a magnetic bubble memory element made up of a thin magnetic film so as to store information according to the presence or absence of the magnetic bubbles. The detection of the magnetic bubbles, that is, the bubble output is made by applying a rotating magnetic field to the magnetic bubble memory element to move the magnetic bubbles along a propagation pattern, causing the magnetic bubbles to pass by a detector provided at a portion of the magnetic bubble memory element, causing the resistance value of the detector to vary, and detecting such a resistance variation.

FIG. 1 shows one example of a conventional output signal detector of a magnetic bubble memory element 1 comprising a magnetic film. A detector 2a is provided along a propagation path, not shown, of the magnetic memory element and a dummy detector 2b is provided at a portion of the magnetic bubble memory element 1, one end of the respective detectors 2a and 2b being grounded. Constant current sources 3a and 3b are provided for passing constant currents for detection of the resistance variations of both the detectors 2a and 2b. There are also provided a preamplifier 4 for amplifying a variation in the potential across the detectors 2a and 2b corresponding to the variation in the resistance values of the detectors 2a and 2b, a DC regenerating circuit 5 which, in response to an external DC regeneration control signal $W_{ST}$, DC regenerates a bubble detection signal variation from an amplified potential variation, and a discriminator 6 which, in response to an external strobe pulse $N_{ST}$, converts a DC regenerated signal into a "1" or "0" logical signal.

In the magnetic bubble detector having a construction as described above, the bubble output signal superimposed on a noise waveform N as shown in FIG. 2 is detected and converted into a logical output signal. In this case, one bubble output signal tends to undergo phase shifts due to the variation in the intensity of the rotating magnetic field, a minute change in the magnetic body utilized as the detector, and variation in the manufacturing steps, resulting in a waveform $S_1$, $S_2$ or $S_3$ as shown in FIG. 2. Therefore, the bubble output signal detection must cover any one of the waveforms $S_1$, $S_2$ and $S_3$ in order to prevent failure of detection of one bubble output signal. Thus, a DC regeneration control signal $W_{ST}$ as shown in FIG. 2 is externally applied which has a sufficient duration for DC regeneration of any one of the bubble output signal waveforms $S_1$, $S_2$ and $S_3$. In synchronism with the control signal $W_{ST}$, the waveforms N, $S_1$, $S_2$ and $S_3$ are DC regenerated to produce corresponding waveforms N', $S_1'$, $S_2'$ and $S_3'$ as well known in the art. At the same time, a threshold level Vth is set which is about half the level difference between a maximum and a minimum (a positive peak of the waveform $S_3'$ and a negative peak of the waveform $S_2'$ in this example). In the discriminator 6, within the duration of a strobe signal $N_{ST}$, portions of the DC regenerated waveforms $S_1'$, $S_2'$ and $S_3'$ falling below the threshold level Vth are converted into logical signals of high level $S_{10}$, $S_{20}$ and $S_{30}$ as shown in FIG. 2. Obviously, the margin of the logical conversion is small for the DC regenerated waveform $S_3'$, and the logical high level signal $S_{30}$ has the smallest duration of the three signals and is critical because if the bubble output signal $S_3$ shifts slightly to the right in the drawing, the high level signal $S_{30}$ will disappear, resulting in failure to detect one bubble output signal represented by the waveform $S_3$. Of course, prolongation of the duration of the control signal $W_{ST}$ is not a practical solution to this problem in view of the resolution of the bubble output signal detection.

SUMMARY OF THE INVENTION

Accordingly, it is an object of this invention to provide an improved output detector of a magnetic bubble memory device capable of gaining a sufficient margin of the logical conversion for one bubble output signal without degrading the resolution of the bubble output signal detection.

According to this invention, there is provided a detector of a magnetic bubble memory device of the type comprising a magnetic bubble memory element having a detector, means for passing constant current through the detector so as to produce a bubble output signal according to the magnetoresistive effect of the detector, a preamplifier for amplifying the output signal, circuit means for DC regenerating an output signal of the preamplifier and a discriminator for converting the DC regenerated signal into a logical signal, characterized by a holding circuit connected between the preamplifier and the discriminator for holding a peak value of the DC regenerated signal for a predetermined time.

BRIEF DESCRIPTION OF THE DRAWINGS in the accompanying drawings.

DESCRIPTION OF THE PREFERRED EMBODIMENT

Figure 1:
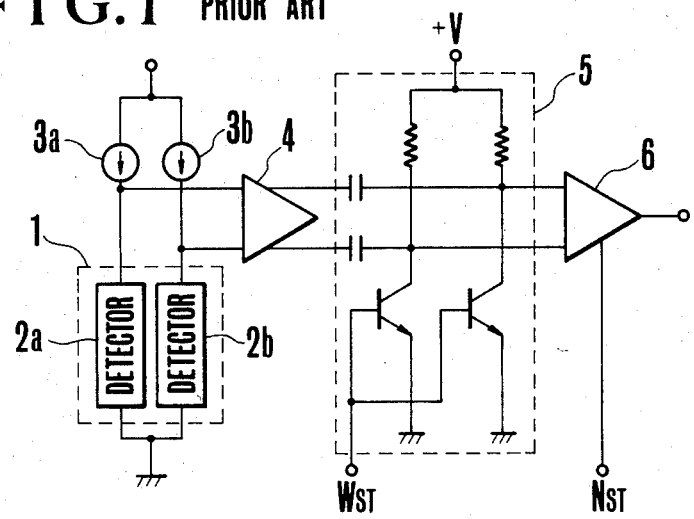
FIG. 1 is a connection diagram showing the essential component elements of a prior art output detector of a magnetic bubble memory device.
Figure 3:
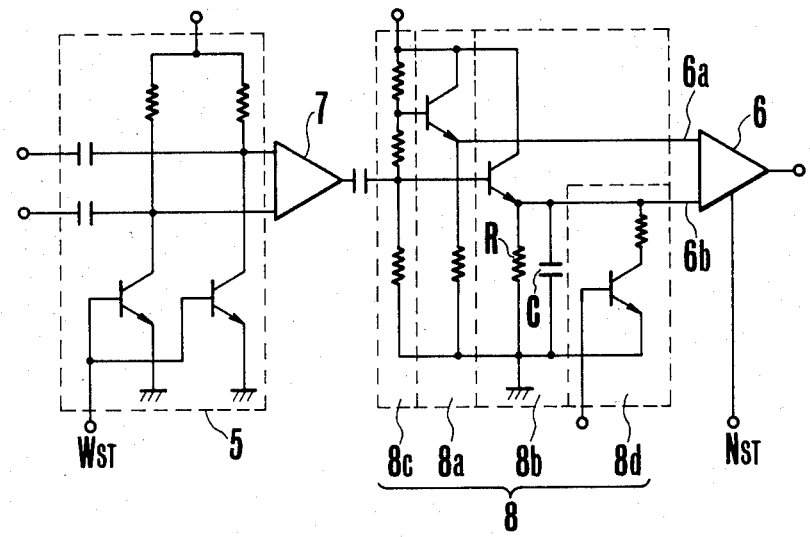
FIG. 3 shows a connection diagram of an output detector of a magnetic bubble memory device embodying the invention.

In FIG. 3 showing a preferred embodiment of this invention, circuit elements corresponding to those shown in FIG. 1 are designated by the same reference numerals. As shown, an amplifier 7 is connected to the output terminals of a DC regenerating circuit 5 for decreasing common mode noise at the time of the DC regeneration, and to the output terminal of the amplifier 7 is connected a peak value holding circuit 8 which holds for a definite time the maximum value of the DC regenerated output wave from the amplifier 7. The peak value holding circuit 8 is constituted by an emitter follower circuit 8a which effects a current amplification of the output of the amplifier 7 at a high fidelty, a peak holding circuit 8b for holding the peak value of the DC regenerated waveform for a definite time, a bias circuit 8c for applying a predetermined bias voltage to the emitter follower circuit 8a and the peak holding circuit 8b, and a releasing circuit 8d which releases the peak holding circuit 8b after a definite time. The time constant of the peak holding circuit 8b, determined by a resistor R and a capacitor C, is selected such that it maintains the same potential between positive and negative peaks of the bubble output signal, that is between 500 ns and 1 (one) microsecond when the frequency of the rotating magnetic field is 100 KHz. The descriminating circuit 6 is connected to the output of the peak voltage holding circuit 8. Thus, the output terminal of the emitter follower circuit 8a is connected to one input terminal 6a of the descriminating circuit 6, while the output terminal of the peak holding circuit 8b is connected to the other input terminal 6b of the descriminating circuit 6.

Figure 2:
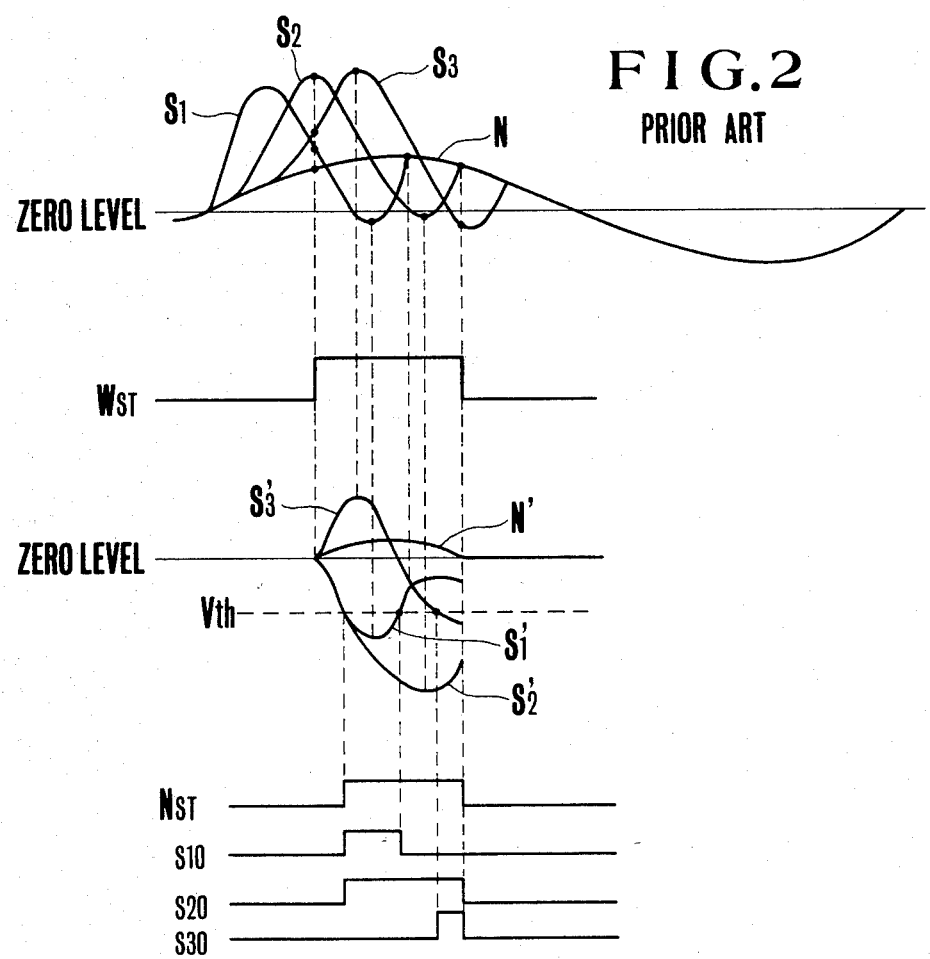
FIG. 2 shows signal waveforms for explaining the operation of the detector shown in FIG. 1.
Figure 4:
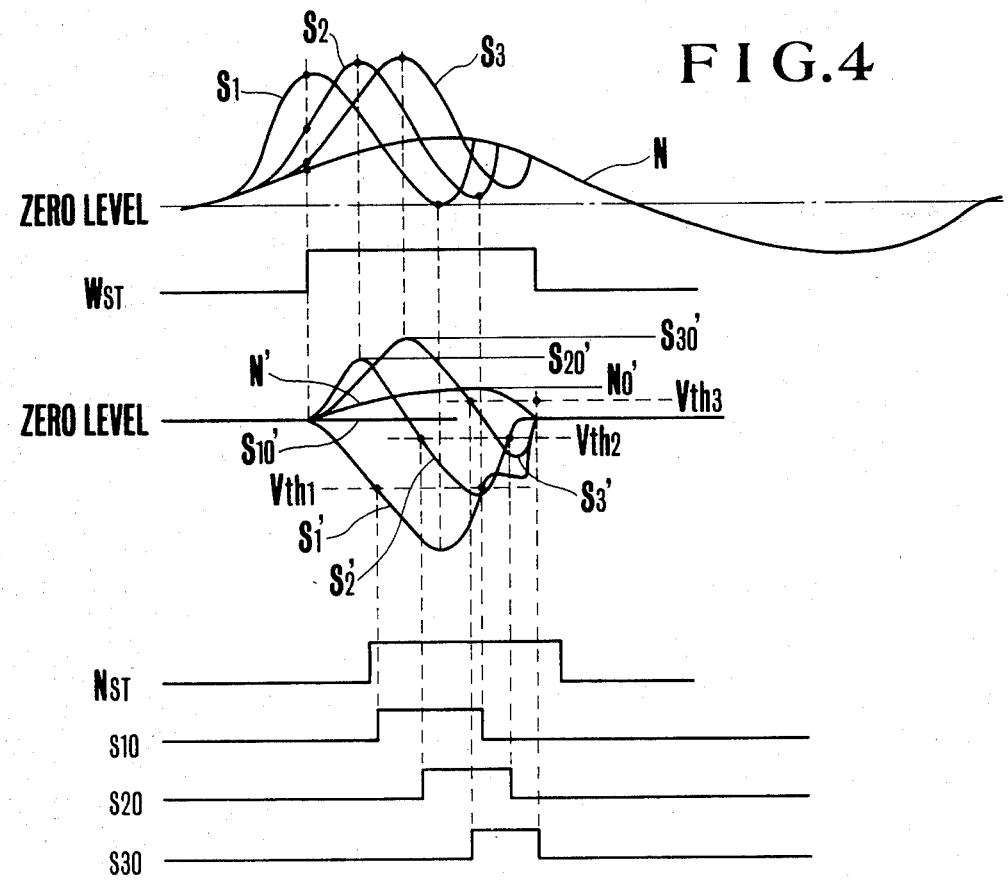
FIG. 4 shows signal waveforms useful to explain the operation of the detector shown in FIG. 3.

In operation, as in the previous example, bubble output signal waveform $S_1$, $S_2$ or $S_3$ superimposed on a noise waveform N is DC regenerated at the DC regenerating circuit 5 within a duration of a DC regeneration control signal $W_{ST}$. A corresponding DC regenerated signal $N_1'$, $S_1'$, $S_2'$ or $S_3'$ is obtained as shown in FIG. 4. In contrast to the prior art detector previously described with reference to FIGS. 1 and 2, this embodiment comprised of the peak value holding circuit 8 holds a positive peak of the DC regenerated waveform $N_1'$, $S_1'$, $S_2'$ or $S_3'$ to provide a holding level $N_0'$, $S_{10}'$, $S_{20}'$ or $S_{30}'$ for the predetermined time. In the discriminating circuit 6, for the DC regenerated waveform $S_1'$, a threshold level $V_{th1}$ is set which is about half the level difference between the holding level $S_{10}'$ and a negative peak of $S_1'$; for the DC regenerated waveform $S_2'$, a threshold level $V_{th2}$ is set which is about half the level difference between the holding level $S_{20}'$ and a negative peak of $S_2'$; and for the DC regenerated waveform $S_3'$, a threshold level $V_{th3}$ is set which is about half the level difference between the holding level $S_{30}'$ and a negative peak of $S_3'$. Now, within a duration of a strobe signal NsT applied to the discriminating circuit 6, a portion of the DC regenerated waveform $S_1'$, $S_2'$ or $S_3'$ falling below the threshold level $V_{th1}$, $V_{th2}$ or $V_{th3}$ is converted into a logical signal of high level $S_{10}$, $S_{20}$ or $S_{30}$. Since, in this embodiment, a sufficient margin of the logical conversion for one bubble output signal is obtained, the duration of the logical high level signal $S_{10}$, $S_{20}$ or $S_{30}$ is relatively uniform and sufficient for prevention of failure of the bubble output signal detection.

What is claimed is:

1. In a detector of a magnetic bubble memory device of the type comprising a magnetic bubble memory element having a detector, means for passing constant current through said detector so as to produce a bubble output signal according to the magnetoresistive effect of said detector, a preamplifier for amplifying said output signal, circuit means for DC regenerating and output signal of said preamplifier, and a discriminator for converting said DC regenerated signal into a logical signal, the improvement which comprises a holding circuit connected between said preamplifier and said discriminator for holding a peak value of the DC regenerated signal for a predetermined time wherein the output signal from said DC regeneration is transmitted to said holding circuit to produce a first output therefrom to be made a first input to said discriminator and the other input to said discriminator is the peak value of said output signal, said discriminator providing a threshold level set at a predetermined voltage with respect to said first input for a comparison with said second input to generate a logical signal.

2. In a detector of a magnetic bubble memory device of the type comprising a magnetic bubble memory element having a detector, means for passing constant current through said detector so as to produce a bubble output signal according to the magnetoresistive effect of said detector, a preamplifier for amplifying said output signal, circuit means for DC regenerating an output signal of said preamplifier, and a discriminator for converting said DC regenerated signal into a logical signal, the improvement which comprises a holding circuit connected between said preamplifier and said discriminator for holding a peak value of the DC regenerated signal for a predetermined time and wherein said discriminator comprises an operational amplifier having two input terminals, and said holding circuit comprises an emitter follower circuit connected to an output terminal of said preamplifier for amplifying an output of said preamplifier, a peak holding circuit also connected to the output terminal of said preamplifier for holding a peak value of a voltage waveform for a predetermined time, a bias circuit for applying a predetermined bias voltage to said emitter follower circuit and to said peak holding circuit, and a release circuit for releasing said peak holding circuit after a predetermined interval, and wherein an output signal of said emitter follower circuit is applied to one input terminal of said operational amplifier and an output signal of said peak holding circuit is applied to the other input terminal of said operational amplifier.

* * * * *